(12) United States Patent
Nath et al.

(10) Patent No.: US 11,256,845 B2
(45) Date of Patent: Feb. 22, 2022

(54) MACHINE-LEARNING DRIVEN PREDICTION IN INTEGRATED CIRCUIT DESIGN

(71) Applicant: Synopsys, Inc., Mountain View, CA (US)

(72) Inventors: Siddhartha Nath, Santa Clara, CA (US); Vishal Khandelwal, Portland, OR (US); Sudipto Kundu, Sunnyvale, CA (US); Ravi Mamidi, Milpitas, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/015,757

(22) Filed: Sep. 9, 2020

(65) Prior Publication Data

US 2021/0073456 A1    Mar. 11, 2021

Related U.S. Application Data

(60) Provisional application No. 62/898,086, filed on Sep. 10, 2019.

(51) Int. Cl.
| | | |
|---|---|---|
| *G06F 30/396* | (2020.01) | |
| *G06F 30/3947* | (2020.01) | |
| *G06N 20/00* | (2019.01) | |
| *G06F 30/3953* | (2020.01) | |
| *G06K 9/62* | (2022.01) | |
| *G06N 5/00* | (2006.01) | |

(52) U.S. Cl.
CPC ........ *G06F 30/3947* (2020.01); *G06F 30/396* (2020.01); *G06F 30/3953* (2020.01); *G06K 9/6232* (2013.01); *G06K 9/6256* (2013.01); *G06N 5/003* (2013.01); *G06N 20/00* (2019.01)

(58) Field of Classification Search
CPC ............................ G06F 30/3947; G06N 20/00
USPC ......................................................... 716/126
See application file for complete search history.

(56) References Cited

U.S. PATENT DOCUMENTS

| | | | |
|---|---|---|---|
| 10,192,016 B2 * | 1/2019 | Ng .................. | G06F 30/327 |
| 10,867,091 B1 * | 12/2020 | Oh .................. | G06F 30/327 |
| 10,915,685 B1 * | 2/2021 | Gupta .............. | G06F 30/3312 |
| 11,003,826 B1 * | 5/2021 | Dasasathyan ....... | G06F 30/392 |
| 2010/0005041 A1 * | 1/2010 | Wang .............. | G01R 31/2894 |
| | | | 706/12 |

(Continued)

OTHER PUBLICATIONS

A.B. Kahng, et al., "Learning-Based Approximation of Interconnect Delay and Slew in Signoff Timing Tools", Proc. ACM/IEEE International Workshop on System-Level Interconnect Prediction, 2013, pp. 1-8.

(Continued)

*Primary Examiner* — Suchin Parihar
(74) *Attorney, Agent, or Firm* — Park, Vaughan, Fleming & Dowler LLP; Laxman Sahasrabuddhe

(57) ABSTRACT

Training data is collected for each training integrated circuit (IC) design of a set of training IC designs by: extracting a first set of IC design features in a first stage of an IC design flow, and extracting a first set of IC design labels in a second stage of the IC design flow, where the first stage of the IC design flow occurs earlier than the second stage of the IC design flow in the IC design flow. Next, a machine learning model is trained based on the training data.

17 Claims, 5 Drawing Sheets

(56) References Cited

U.S. PATENT DOCUMENTS

| | | | |
|---|---|---|---|
| 2010/0077372 A1* | 3/2010 | Xiang | G06F 30/20 |
| | | | 716/106 |
| 2017/0076116 A1* | 3/2017 | Chen | G06N 20/10 |
| 2018/0129771 A1* | 5/2018 | Hashimoto | G06F 30/34 |
| 2018/0260498 A1* | 9/2018 | Nagaraja | G06F 30/3323 |
| 2020/0104458 A1* | 4/2020 | Chuang | G06N 20/20 |
| 2020/0226742 A1* | 7/2020 | Sawlani | G06T 7/0004 |
| 2020/0401669 A1* | 12/2020 | Gupta | G06K 9/00536 |
| 2021/0287120 A1* | 9/2021 | Mamidi | G06N 5/003 |

OTHER PUBLICATIONS

A.B. Kahng, et al., "A Deep Learning Methodology to Proliferate Golden Signoff Timing", Proc. Design, Automation and Test in Europe, 2014, pp. 1-6.

S.S. Han, et al., "SI for Free: Machine Learning of Interconnect Coupling Delay and Transition Effects", Proc. ACM/EEE International Workshop on System-Level Interconnect Prediction, 2015, pp. 1-8.

Rick Carvajal Barboza, et al., "Machine Learning-Based Pre-Routing Timing Prediction with Reduced Pessisism", DAC, Jun. 2-6, 2019, Las Vegas, NV.

Andrew B. Kahng, "New Directions for Learning-Based IC Design Tools and Methodologies", IEEE 2018, pp. 405-410.

Bai Lida et al., "Machine-Learning-Based Early-Stage Timing Prediction in SoC Physical Design", Proc. 14th IEEE International Conference on Solid-State and Integrated Circuit Technology, pp. 1-3, Oct. 31, 2018.

Han Kwangsoo et al., "A Global-Local Optimization Framework for Simultaneous Multi-Mode Multi-Corner Clock Skew Variation Reduction", 2015 52nd ACM/EDAC/IEEE Design Automation Conference, pp. 1-6, Jun. 8, 2015.

Anonymous, "Machine Learning—Wikipedia", retrieved from the Internet: URL:https://en.wikipedia.org/w/index.php?title=Machine_learning&oldid=8864600042, retrieved on Jun. 16, 2020.

* cited by examiner

MACHINE-LEARNING DRIVEN PREDICTION IN INTEGRATED CIRCUIT DESIGN

RELATED APPLICATION

This application claims the benefit of U.S. Provisional Application Ser. No. 62/898,086, filed on 10 Sep. 2019, the contents of which are herein incorporated by reference in their entirety for all purposes.

TECHNICAL FIELD

The present disclosure generally relates to integrated circuit (IC) design. More specifically, the present disclosure relates to machine-learning driven prediction in IC design.

BACKGROUND

Advances in process technology and an increasing demand for computing and storage have fueled an increase in the size and complexity of IC designs. Such advances can be attributed to the improvements in semiconductor design and manufacturing technologies which have made it possible to integrate tens of millions of devices onto a single chip.

SUMMARY

Some embodiments described herein collect training data for each training IC design of a set of training IC designs by: extracting a first set of IC design features in a first stage of an IC design flow, and extracting a first set of IC design labels in a second stage of the IC design flow, where the first stage of the IC design flow occurs earlier than the second stage of the IC design flow in the IC design flow. Next, a machine learning model is trained so that the machine learning model predicts the first set of IC design labels based on the first set of IC design features using the training data. Specifically, a supervised learning technique is used to train the machine learning model.

In some embodiments, the first stage may belong to a pre-route portion of the IC design flow, which may end after global routing has been completed in the IC design flow. In some embodiments, the second stage may belong to a post-route portion of the IC design flow, which may begin after track assignment and detailed routing has been completed in the IC design flow.

In some embodiments, the first stage may belong to a pre-clock-network-synthesis portion of the IC design flow, which may end after post-placement optimization has been completed in the IC design flow. In some embodiments, the second stage may belong to a post-clock-network-synthesis portion of the IC design flow, which may begin after clock network synthesis has been completed in the IC design flow.

In some embodiments, training the machine learning model to predict the IC design labels based on the IC design features includes reducing an error term that represents an aggregate error between the predicted IC design labels and the actual IC design labels (which were extracted during the second stage of the IC design flow). In particular, reducing the error term may include iteratively modifying parameters of the machine learning model.

In some embodiments, the IC design features includes, but are not limited to, a count of logic stages in a combinational logic cloud, average fanout in the combinational logic cloud, a count of inverters and buffers, a count of cells that have modification restrictions, a count of transition violations, a ratio between an aggregate net delay and an aggregate cell delay, position of cells, and size of cells.

In some embodiments, the IC design labels includes, but are not limited to, an arrival time at a timing endpoint, a required time at the timing endpoint, a timing slack at the timing endpoint, a slew at the timing endpoint, a noise margin at the timing endpoint, an arrival time at a terminal of a logic gate, a required time at the terminal of the logic gate, a timing slack at the terminal of the logic gate, a slew at the terminal of the logic gate, a noise margin at the terminal of the logic gate.

Some embodiments use the trained model while processing a given IC design (which may be not be in the set of training IC designs). Specifically, while the given IC design is being processed by the first stage of the IC design flow, the embodiments extract a second set of IC design features, use the trained machine learning model to predict a second set of IC design labels based on the second set of IC design features, and perform an operation on the given IC design based on the second set of IC design labels. In particular, the embodiments may select a type and/or an extent of a modification based on the second set of IC design labels, and apply the selected modification to the given IC design.

BRIEF DESCRIPTION OF THE FIGURES

The disclosure can be understood based on the detailed description given below and the accompanying figures. The figures are for illustrative purposes, and do not limit the scope of the disclosure. Furthermore, the figures are not necessarily drawn to scale.

DETAILED DESCRIPTION

Figure 1:
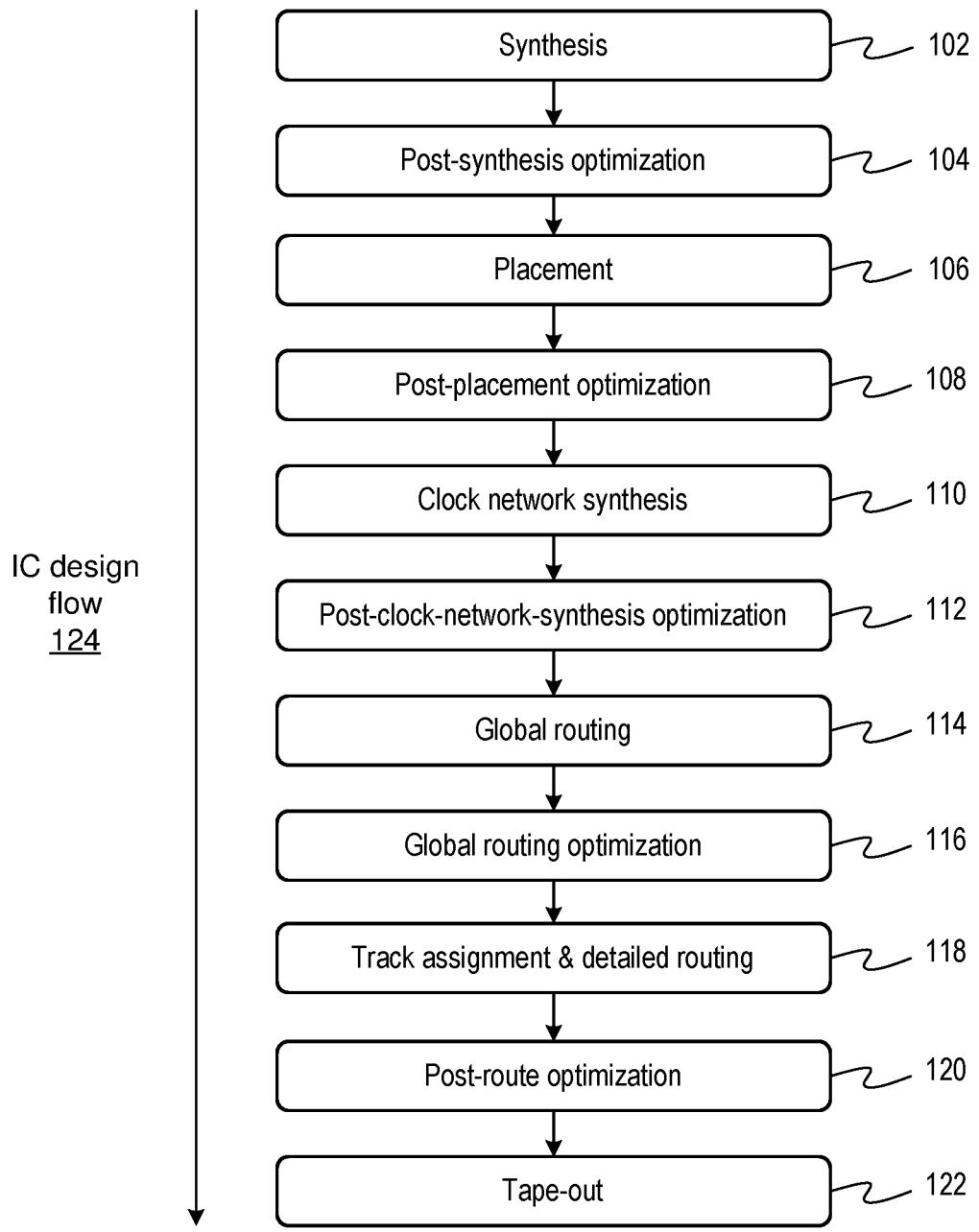
FIG. 1 illustrates an IC design flow in accordance with some embodiments described herein.

In this disclosure, the term "IC design flow" refers to a process for designing ICs. An IC design flow typically includes many stages (the terms "stage," "step," and "process" are used interchangeably in this disclosure). For example, clock network synthesis is an example of a stage in the IC design flow during which a clock network is constructed for distributing clock signals to sequential circuit elements in the IC design. Routing is an example of a stage that occurs toward the end of the IC design flow. A routing process can take multiple inputs, including, but not limited to, a placed netlist which includes cells with known locations (i.e., placed cells), but which does not include routed wires that electrically interconnect the cells with one another. The routing process determines wire routes to interconnect the placed cells with one another, and outputs a placed-and-routed netlist that includes the placed cells, and includes wire routes that electrically interconnect the placed cells with one another. A number of optimization criteria may be used during routing, which include, but are not limited to, reducing design rule violations, reducing via count, reducing total wire length, reducing the likelihood of timing violations, etc.

The accuracy of timing information (e.g., delay, slack, slew, signal integrity, etc.) improves as the IC design progresses through the IC design flow. For example, after clock network synthesis, the impact of clock skew on the timing information can be accurately calculated. Likewise, parasitic electrical properties (e.g., parasitic resistances and capacitances) of the wires impact timing, but parasitic electrical properties are not be known with a high degree of accuracy until routing has been completed. Thus, after routing has been completed on an IC design, the timing information of the IC design may be calculated using an accurate timing model that uses the actual wire routes in its calculations, and the accurately calculated timing information may be used to ensure that the IC design meets a set of timing constraints.

A set of constraints may be checked in the IC design as the IC design progresses through the IC design flow. If a constraint is violated, the IC design may need to be sent back to a previous stage for additional design iterations, which may increase project costs and delays. For example, a backend signoff process may be used to check timing constraints using post-route timing information that is calculated using a timing model that uses the actual wire routes in the IC design. If the IC design satisfies the constraints that are checked in the backend signoff process, then the IC design may be determined as ready for manufacturing. On the other hand, if a timing problem is found during the backend signoff process, then the IC design may need to be sent back to a previous design stage for additional design iterations, which may significantly increase project costs and delays.

Some embodiments described in this disclosure use machine learning to predict IC design labels that are expected to occur in a later stage in the IC design flow. The predicted labels are used to perform IC design operations (e.g., placement and optimization operations) during a current stage in the IC design flow. Advantages of embodiments disclosed herein include, but are not limited to, faster timing closure in the IC design flow, and a better quality of results produced by the IC design flow.

In this disclosure, the terms "IC design feature" and "IC design label" generally refer to any quantity in an IC design. Examples of IC design features or labels include, but are not limited to, delay, slack, slew, noise margin, a count of logic stages in a combinational logic cloud, average fanout in the combinational logic cloud, a count of inverters and buffers, a count of cells that have modification restrictions, a count of transition violations, a ratio between an aggregate net delay and an aggregate cell delay, position of cells, size of cells, etc. In the machine learning arts, the term "feature" refers to quantities that are provided as inputs to the machine learning model (i.e., the values based on which a prediction is to be made), and the term "label" refers to quantities that are produced as outputs by the machine learning model (i.e., the values that are predicted by the machine learning model).

FIG. 1 illustrates an IC design flow in accordance with some embodiments described herein.

During synthesis 102, a logic design is converted into a post-synthesis netlist that contains cells. During post-synthesis optimization 104, cells in the post-synthesis netlist is replaced with other functionally equivalent cells to optimize timing, area, and/or leakage power of the IC design. During placement 106, cells in the post-synthesis netlist is assigned locations in the IC design layout area. During post-placement optimization 108, cells in the post-synthesis netlist is moved and/or replaced with other functionally equivalent cells to optimize timing, area, and/or leakage power of the IC design. During clock network synthesis 110, a clock network is constructed for distributing clock signals to sequential cells in the IC design. During post-clock-network-synthesis optimization 112, the clock network is modified (e.g., the clock network topology may be modified, clock buffers may be added, removed, or replaced, etc.) to optimize timing, area, and/or leakage power of the IC design.

After post-clock-network-synthesis optimization 112, wire routes are determined for electrically interconnecting cells in the IC design. Routing may include three distinct stages: global routing, track assignment, and detailed routing. In some embodiments, the track assignment and detailed routing operations may be combined into a single stage. Specifically, during global routing 114, the process may determine approximate net topologies and route paths in the IC design layout to reduce overall routing congestion and wire length. The approximate net topologies and route paths may then be optimized during global routing optimization 116.

The track assignment and detailed routing 118 stage refines the global routing plan by assigning wires to tracks (a track refers to a closely spaced bundle of wire routes) in the track assignment step, and then determine the exact path and specific shapes for each wire in the detailed routing step. Track assignment and detailed routing 118 is typically the most time-consuming and computationally intensive operation in routing.

Next, the IC design flow may perform post-route optimization 120 (and optionally other operations) to obtain a final IC design, which can be taped-out 122 if the final IC design satisfies a desired set of constraints that may be checked during a backed signoff process. Specifically, during post-route optimization 120, nets that violate timing constraints, design rules, and/or signal integrity constraints may be rerouted.

In this disclosure, a pre-clock-network-synthesis IC design flow includes one or more IC design flow operations that are performed on the IC design before clock network synthesis 110 stage begins on the IC design, and a post-clock-network-synthesis IC design flow includes one or more IC design flow operations that are performed on the IC design after clock network synthesis 112 completes on the IC design.

Likewise, a pre-route IC design flow includes one or more IC design flow operations that are performed on the IC design before track assignments and detailed routing 118 stage begins on the IC design, and a post-route IC design flow includes one or more IC design flow operations that are performed on the IC design after track assignments and detailed routing 118 stage completes on the IC design.

Figure 2:
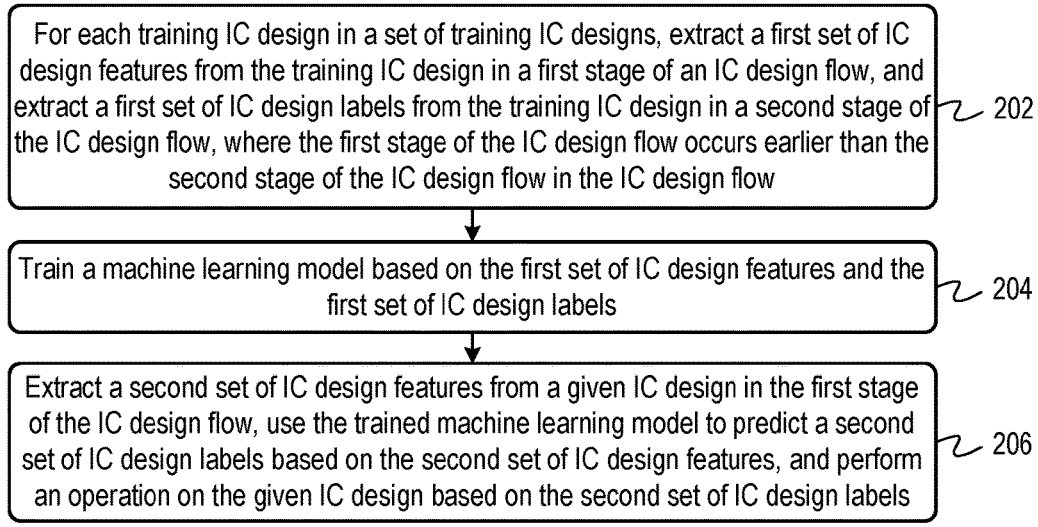
FIG. 2 illustrates a process for using machine learning to predict IC design labels based on IC design features in accordance with some embodiments described herein.

FIG. 2 illustrates a process for using machine learning to predict IC design labels based on IC design features in accordance with some embodiments described herein.

For each training IC design in a set of training IC designs, the process may extract a first set of IC design features from the training IC design in a first stage of an IC design flow, and extract a first set of IC design labels from the training IC design in a second stage of the IC design flow, where the first stage of the IC design flow occurs earlier than the second stage of the IC design flow in the IC design flow (at 202).

In some embodiments, the first stage of the IC design flow belongs to a pre-route portion of the IC design flow, and the second stage belongs to a post-route portion of the IC design flow. In some embodiments, the first stage of the IC design flow belongs to a pre-clock-tree-synthesis portion of the IC design flow, and the second stage belongs to a post-clock-tree-synthesis portion of the IC design flow In this disclosure, the term "clock group" refers to timing paths in an IC design that are in the same clock domain, and the term "path group" generally refers to an arbitrary collection of timing paths that have been grouped into a particular group. Specifically, a given timing endpoint may have different required times for different path groups. In this disclosure, the term "corner" refers to a particular set of manufacturing conditions (or process conditions) under which the IC design may be manufactured and/or a particular set of operating conditions under which the IC design may be operated. In this disclosure, the term "mode" refers to a particular operation mode (e.g., a standby mode, a mission mode, and a test mode) in which the IC design may be operated. In this disclosure, the term "multi-corner multi-mode (MCMM) scenario" refer to a combination of particular corner and particular mode. Note that the electrical characteristic of cells and wire routes is different for each MCMM scenario, which cause the timing information to be different for each MCMM scenario.

Some embodiments collect ground truth (i.e., true labels) from any part of the IC design flow. Examples of training data collected from the IC design flow include, but are not limited to, IC design data from a post-detail-routed IC design, IC design data from an initial stage of post-route optimization, IC design data from any intermediate phase of post-route optimization, or IC design data from the end of post-route optimization. In particular, ground truth is collected for all constrained end-points in each MCMM scenario and for each clock and path groups. In other words, embodiments described herein is used with any kind of IC design with any number of MCMM scenarios and path groups.

In some embodiments, the features and labels that are extracted from the IC designs are not specific to any particular design style or technology. In particular, the extracted features and labels are generally applicable to all design styles across technology nodes. Examples of extracted features and labels include, but are not limited to, a count of logic stages, required time at an end-point or at a terminal of a logic gate, arrival time at an end-point or at a terminal of a logic gate, a count of fanouts, etc. Embodiments disclosed herein use a feature set that comprehensively explain variation in fitting the ground truth timing, which has been demonstrated through experimental results.

Referring to FIG. 2, the process may train a machine learning model based on the first set of IC design features and the first set of IC design labels (at 204). Specifically, a supervised learning technique may be used to train the machine learning model so that the trained machine learning model accurately predicts (within a tolerance range) the first set of IC design labels based on the first set of IC design features.

In particular, predicting post-route timing based on pre-route features may be challenging because the feature values can change significantly between a pre-route IC design and a corresponding post-route IC design. Accordingly, in some embodiments, a machine learning model is selected that is tolerant to variation in the output (i.e., the ground truth or post-route timing). Selecting a machine learning model that is tolerant to variation may be important to accurately predict post-route timing (which may be affected by multiple advanced features and physical effects) based on pre-route IC design features.

Some embodiments use tree-based machine learning models that are well-suited to model large output variations because each sub-tree can model a subspace of variation in the output (relative to input features). Specifically, random forest-based machine learning models may be well suited for this purpose because the model can assign multiple trees to handle multiple variations in the output with respect to different subspaces of pre-route IC design features. Some embodiments use gradient-boosted random forests because each boosted forest can incrementally fit tougher output variations that earlier forests in the chain cannot accurately fit.

Some embodiments use neural networks (and its variants such as deep neural networks, deep learning architectures, etc.) which may also be well-suited for predicting post-route timing based on pre-route IC design features. In these embodiments, the neural network may accurately model output variation with a rich feature-set once the neural network has been tuned for the number of layers and number of hidden neurons per layer. Note that, neural networks are typically slower at inferencing compared to gradient-boosted random forests. Therefore, a gradient-boosted random forest-based approach may be used in applications where a fast inference speed is desired, e.g., in applications where the trained machine learning model is used repeatedly for guiding and/or performing incremental optimizations in an IC design flow.

Figure 3:
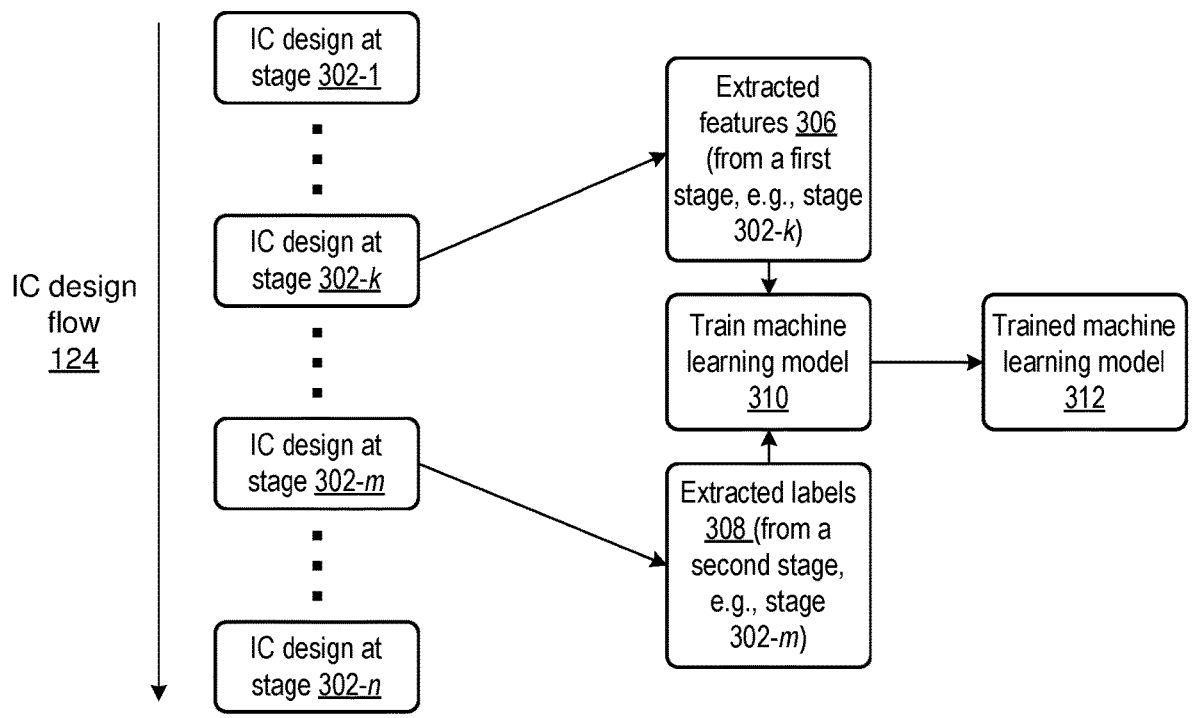
FIG. 3 illustrates how IC design features and IC design labels can be used to train a machine learning model in accordance with some embodiments described herein.

FIG. 3 illustrates how IC design features and IC design labels can be used to train a machine learning model in accordance with some embodiments described herein.

When an IC design is processed using IC design flow 124, the IC design may contain different content in the different stages, e.g., IC design at 302-1 through IC design at 302-$n$ may contain different content, and in particular the IC design in later stages may contain more detailed or more optimized layouts than in earlier stages. In FIG. 3, the literals k and m refer to numbers that are between 1 and n, i.e., $1<k<m<n$. Each stage in IC design flow 124 works on an IC design that is outputted by the previous stage, e.g., stage 302-$m$ works on the IC design outputted by stage 302-(m-1). Extracted features 306 may be extracted from IC design 302-$k$ (which may correspond to a first stage of the IC design flow), and extracted labels 308 may be extracted from IC design 302-$m$ (which may correspond to a second stage of the IC design flow). Next, extracted features 306 and extracted labels 308 may be used to train machine learning model 310.

In general, the machine learning model includes an error term that represents an aggregate error (e.g., a root mean square error) between predicted labels (e.g., timing slacks at timing end-points that are predicted based on features extracted from the first stage) and actual labels (e.g., the actual slacks at the timing end-points extracted from the second stage). Training the machine learning model involves reducing the error term by iteratively modifying parameters of the machine learning model. The machine learning model's parameter values at the end of the training process represents the trained machine learning model 312.

Referring to FIG. 2, the process may use the trained machine learning model during the IC design flow, e.g., the process may use the trained machine learning model while a given IC design, which may not be in the set of training IC designs, is being processed by the first stage of the IC design flow. Specifically, the process may extract a second set of IC design features from the given IC design in the first stage of the IC design flow, use the trained machine learning model to predict a second set of IC design labels based on the second set of IC design features, and perform an operation on the given IC design based on the second set of IC design labels (at 206).

Figure 4:
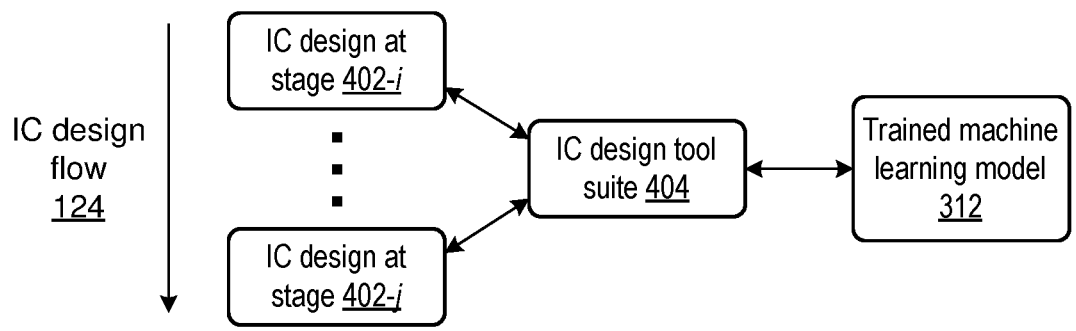
FIG. 4 illustrates how a trained machine learning model may be used during an IC design flow in accordance with some embodiments described herein.

FIG. 4 illustrates how a trained machine learning model is used during an IC design flow in accordance with some embodiments described herein.

IC design tool suite 404 may be used during IC design flow 124. IC design tool suite 404 may transform an IC design as the IC design progresses through IC design flow 124, e.g., the IC design at stage **402-*i* may be transformed into a more detailed or optimized version of the IC design at stage 402-*j* during IC design flow 124. In particular, IC design tool suite 404 may extract IC design features from the IC design during a first stage (e.g., stage 402-*i*) of IC design flow 124, and provide the extracted IC design features to trained machine learning model 312 as input. Trained machine learning model 312 may use the extracted IC design features to predict one or more IC design labels that are expected to occur at a later stage (e.g., stage 402-*j*) in IC design flow 124 (e.g., trained machine learning model 312 may predict post-route timing information), and provide the predicted IC design labels to IC design tool suite 404. IC design tool suite 404** may then use the predicted IC design labels to select the type and extent of modifications to make on the current IC design. Although some embodiments described herein use IC design features and labels extracted from pre-route and post-route IC design flow stages, other embodiments may generally use IC design features and labels extracted from any two stages of an IC design flow.

As one example, a physical design flow may use the trained machine learning model so that the physical design flow may predict timing values that the netlist would "see" much ahead in the flow in an instantaneous manner. For example, pre-route optimization may use the trained machine learning model to accurately predict post-route timing that includes various changes to the netlist, physical context changes (routing, signal integrity, etc.) and timing feature changes (advanced timing models for detail-routed parasitics, signoff tool correlated-timing calculators, etc.).

Once a model has been trained, a pre-route optimization flow may use it as follows: (1) extract features, (2) pass the extracted features to the trained model to predict "look-ahead" timing (slack, arrival, delay, etc.), (3) adjust timing of end-points, stages, cells/nets based on trained model's predictions, and (4) perform one or more optimization steps using the adjusted timing values.

An example of applying the trained model in an optimization loop is as follows. Adjustments based on the trained model may be applied before datapath delay optimization. Next, a new set of features are extracted after concurrent clock and data optimization has been performed. Thereafter, new adjustments may be calculated and applied after recovery optimization.

In one specific example, in a pre-route step, suppose an endpoint's critical path slack in scenario s1 is +3 ps, but it's slack after detail routing is −10 ps. Also, suppose that the model has been trained at the pre-route step to fit detail-routed slack of end-points in all scenarios.

Without using the model, the pre-route delay optimization may not optimize any cells or nets in the critical path to the endpoint in scenario s1. Moreover, area, power recovery may optimize cells and further reduce the slack to +0.5 ps. However, after detail routing, this path has a slack of −10 ps. So, the design's total negative slack degrades after detail routing.

With the model, the endpoint's critical path slack may be adjusted to −9.5 ps (−0.5 ps being modeling error and an adjustment factor of −12.5 ps). Now, pre-route delay optimization may optimize this path and reduce slack to −5 ps. Recovery algorithm may protect this slack from further degrading, and after detail routing the slack may degrade by 5 ps to −10 ps. However, once we remove the adjustment factor of −12.5 ps, the slack of this path is now +2.5 ps. Therefore, when the model was used, the design's total negative slack did not degrade.

In another specific example, suppose that, in a pre-route step, an endpoint's critical path slack in scenario s1 is −5 ps, but it's slack after detail routing is −10 ps. Also suppose that the model is trained at the pre-route step to fit detail-routed slack of end-points in all scenarios.

Without using the model, the pre-route delay optimization may optimize this path to +0 ps. After detail routing, this path has a slack of −5 ps. So, the design's total negative slack degrades after detail routing.

With the model, the endpoint's critical path slack may be adjusted to −6 ps (−1 ps being modeling error and an adjustment factor of −1 ps). Now, pre-route delay optimization may optimize this path and reduce slack to 0 ps. After detailed routing, the slack may degrade by 5 ps to −5 ps. However, once we remove the adjustment factor of −6 ps, the slack of this path is now +1 ps. Therefore, the design's total negative slack did not degrade, in fact, it improved from the case without the model.

Note that embodiments described in this disclosure do not merely predict the timing impact of routing and changes in the accuracy of the timing model. Instead, embodiments described herein also predict the impact of netlist or placement changes that may occur during data and clock optimization. Additionally, note that the pre-route IC design features may be extracted from any pre-route IC design that is processed by a pre-route IC design step, which may include, but is not limited to, synthesis, placement, clock tree synthesis, and clock-optimization. In other words, embodiments described herein are not limited to using features that are extracted from only certain steps in the pre-route IC design flow. Accordingly, embodiments disclosed herein may be used to drive any pre-route engine, e.g., placement, physical synthesis, data, clock optimization, global routing, etc. Specifically, when a pre-route engine has to select a modification from a set of candidate modifications, the pre-route engine may use the trained machine learning model to predict post-route timing information for each of the candidate modifications, and select a candidate modification based on the predicted post-route timing information.

Because the features that are extracted from the pre-route and post-route IC designs are not specific to any particular design style or technology, and are generally applicable to all design styles across technology nodes, the machine learning model described herein may be trained using IC designs implemented using different cell libraries, foundry technologies, and IC design flows. The trained machine learning model may then be used for predicting post-route timing information for IC designs implemented using different foundry technologies and/or cell libraries.

In some embodiments, the machine learning model includes two separate sub-models: a global timing model, and a local timing model. Both of these models may be used in applications described herein. The global timing model may be trained and used to predict timing endpoint slack, which may enable optimization processes to accurately select timing critical paths, thereby leading to faster timing convergence. The local timing model may be trained and used to predict delays and transitions in a logic stage (e.g., a logic stage may refer to a driver gate and a set of load gates that are driven by the driver gate), which may enable optimization processes to accurately evaluate the post-route timing impact of local optimization modifications, thereby preventing local optimization modifications from causing timing issues later in the IC design flow.

Categories of features/labels that may be extracted by embodiments described herein include, but are not limited to: (1) netlist and logical context, (2) physical context, (3) electrical, (4) constraints (MCMM, clocks, path groups, etc.), (5) timing path, and (6) timing (slack, arrival, transition, required, etc.).

Examples of features/labels belonging to the netlist and logical context category include, but are not limited to, a count of stages in the critical path to an endpoint of a timing path, average fan-ins and fan-outs on the timing path, and maximum fan-ins and fan-outs on the timing path.

Examples of features/labels belonging to the physical context category include, but are not limited to, the bounding box of pin locations in a critical timing path to the timing endpoint.

Examples of features/labels belonging to the electrical category include, but are not limited to, maximum transition on a pin on the critical timing path, average transition on a pin on the critical timing path, maximum pin capacitance of a cell in the critical timing path, average pin capacitance of cells in the critical timing path, pin capacitance of clock pins of timing start-points, and pin capacitance of clock pins of timing end-points.

Examples of features/labels belonging to the constraints category include, but are not limited to, maximum transition constraints, maximum capacitance constraints, required time of a timing path, and MCMM scenario.

Examples of features/labels belonging to the timing category include, but are not limited to, cell delay, net delay, pre-route arrival time at a timing endpoint, and pre-route transition times at the timing end point, clock arrival time at the timing start point, and clock arrival time at the timing end point. In some embodiments, clock arrival features may be important for modeling effects of skewing for models fitted to post detail-routed timing labels as well as for models fitted to post-clock-network-synthesis labels. Without these features, models can get misguided when end-points have same values of labels with and without skewing.

Some embodiments depend on sufficiently large spaces of features and ground truth (i.e., labels) during the training phase that can model variations when core engines run and/or when netlist, physical context, constraints, flows, etc. change in the IC design that is not in the set of training IC designs. If there are large changes in any of these categories, the machine learning model may be re-trained with new data such that new variations can be accurately modeled. Specifically, some embodiments described herein detect such large errors, and prompt the user to retrain the model.

Embodiments described herein can predict the timing impact on an IC design due to routing as well as netlist changes. Furthermore, embodiments described herein are used to predict timing parameters other than timing slack. For example, embodiments described herein can predict post-route waveform propagation, slew variation, etc.

Figure 5:
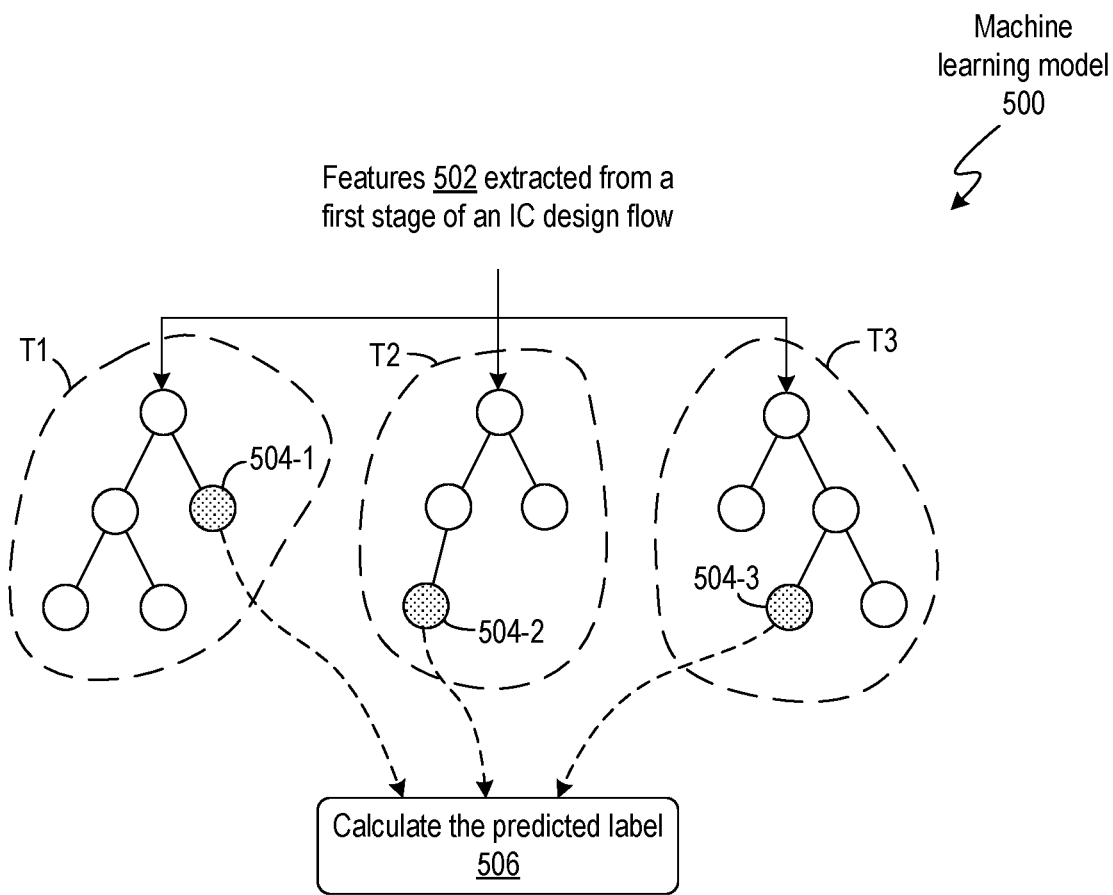
FIG. 5 illustrates an example of a machine learning model in accordance with some embodiments described herein.

FIG. 5 illustrates an example of a machine learning model in accordance with some embodiments described herein. The machine learning model shown in FIG. 5 is for illustration purposes only, and does not limit the scope of the embodiments to the forms disclosed.

Machine learning model 500 may include regression trees T1, T2, and T3. Each non-leaf node of a regression tree may correspond to a condition, and each downward branch emanating from the non-leaf node may correspond to a result of evaluating the condition. For example, if a non-leaf node compares the value of a particular feature with a threshold, then one branch may correspond to the feature having a value that is less than the threshold, and the other branch may correspond to the feature having a value that is greater than or equal to the threshold. Each leaf node may correspond to a subset of the training data that satisfies the conditions on the path from the root node to the leaf node.

Features 502 extracted from a first stage of an IC design flow may be used to traverse down each tree to arrive at a leaf node. For example, traversing the trees T1, T2, and T3 based on features 502 may cause leaf nodes 504-1, 504-2, and 504-3 to be selected. The subsets of training data that correspond to leaf nodes 504-1, 504-2, and 504-3 may then be used to calculate the predicted label 506 (which is expected to exist in the IC design in the second stage of the IC design flow, where the second stage of the IC design is the stage from which labels were extracted for training the machine learning model).

In some embodiments, the mean values of labels in the subsets of training data that corresponds to leaf nodes 504-1, 504-2, and 504-3 may be used to calculate the predicted label. During training, the number of trees, the number of nodes in the tree, the topology of the tree, and the conditions associated with each node may be optimized to reduce an error between the predicted labels and the actual labels.

In some embodiments, the machine learning model may include a random forest that has multiple sets of trees. In some embodiments, each tree may be constructed by using a random split of input features such that the information gain at each node of the tree is maximized. The selected features could be any k features out of N features (k≤N). The depth of each tree may be controlled by using a maximum depth hyperparameter. When multiple trees have been constructed, the output may be polled from all of the trees and averaged. The residual may then be used to construct the subsequent set of trees. The boosting part of the learning technique may iteratively minimize the residual from the previous prediction of trees. The maximum number of trees in the forest may be controlled using a hyperparameter. The predicted label outputted by the model may be a weighted sum of outcomes from the sets of trees. During training, the supervised learning technique may learn the weights based on the structure of the trees (i.e., number of leaves, depth, etc.).

In some embodiments, and more specifically in embodiments that predict timing labels, the process may optimize (i.e., minimize) an particular error metric between predicted labels and actual labels. In particular, some embodiments use the root mean square error (RMSE), and minimize the RMSE metric during training. This metric determines the actual error that may impact the design's total negative slack metric after model adjustments. After evaluating various error metrics (e.g., $R^2$, mean square error, mean of absolute error, etc.), it was found that the RMSE metric correlates strongly with the design timing metrics and minimizing it can truly guide physical design flow optimization engines to achieve better and converged timing metrics.

Figure 6:
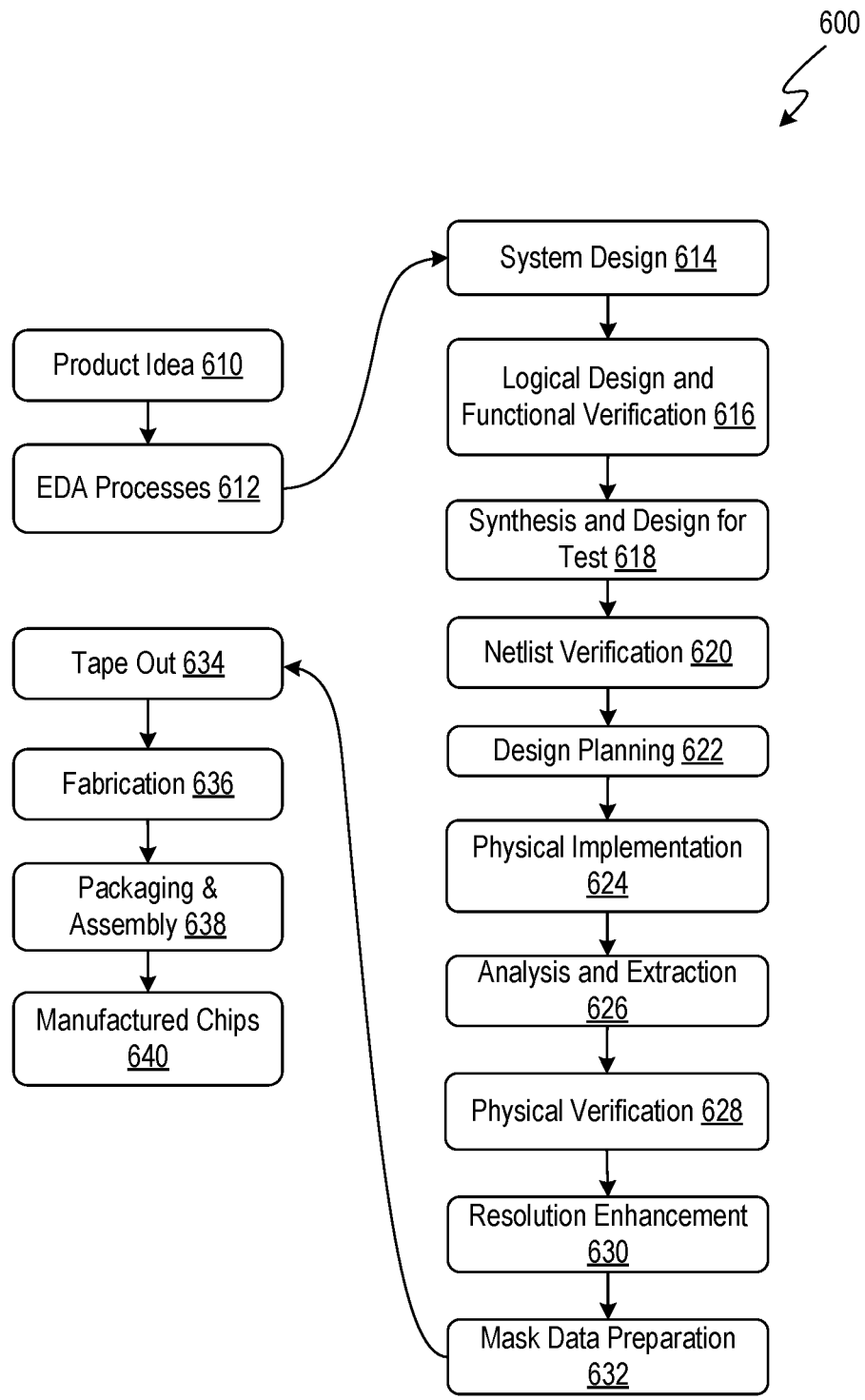
FIG. 6 illustrates an example flow for the design, verification, and fabrication of an integrated circuit in accordance with some embodiments described herein.

FIG. 6 illustrates an example flow 600 for the design, verification, and fabrication of an integrated circuit in accordance with some embodiments described herein.

EDA processes 612 (the acronym "EDA" refers to "Electronic Design Automation") can be used to transform and verify design data and instructions that represent the integrated circuit. Each of these processes can be structured and enabled as multiple modules or operations.

Flow 600 can start with the creation of a product idea 610 with information supplied by a designer, information which is transformed and verified by using EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly 638 are performed to produce the manufactured IC chip 640.

Specifications for a circuit or electronic structure may range from low-level transistor material layouts to high-level description languages. A high-level of abstraction may be used to design circuits and systems, using a hardware description language ("HDL") such as VHDL, Verilog, SystemVerilog, SystemC, MyHDL or OpenVera. The HDL description can be transformed to a logic-level register transfer level ("RTL") description, a gate-level description, a layout-level description, or a mask-level description. Each lower abstraction level that is a less abstract description adds more detail into the design description. The lower levels of abstraction that are less abstract descriptions can be generated by a computer, derived from a design library, or created by another design automation process. An example of a specification language at a lower level of abstraction language for specifying more detailed descriptions is SPICE (which stands for "Simulation Program with Integrated Circuit Emphasis"). Descriptions at each level of abstraction contain details that are sufficient for use by the corresponding tools of that layer (e.g., a formal verification tool).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as test-bench generators, static HDL checkers, and formal verifiers. In some embodiments, special systems of components referred to as 'emulators' or 'prototyping systems' are used to speed up the functional verification.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flip-flop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 700 in FIG. 7) may be used to store the programs and data structures that are used by some or all of the EDA products described herein, and products used for development of cells for the library and for physical and logical design that use the library.

Figure 7:
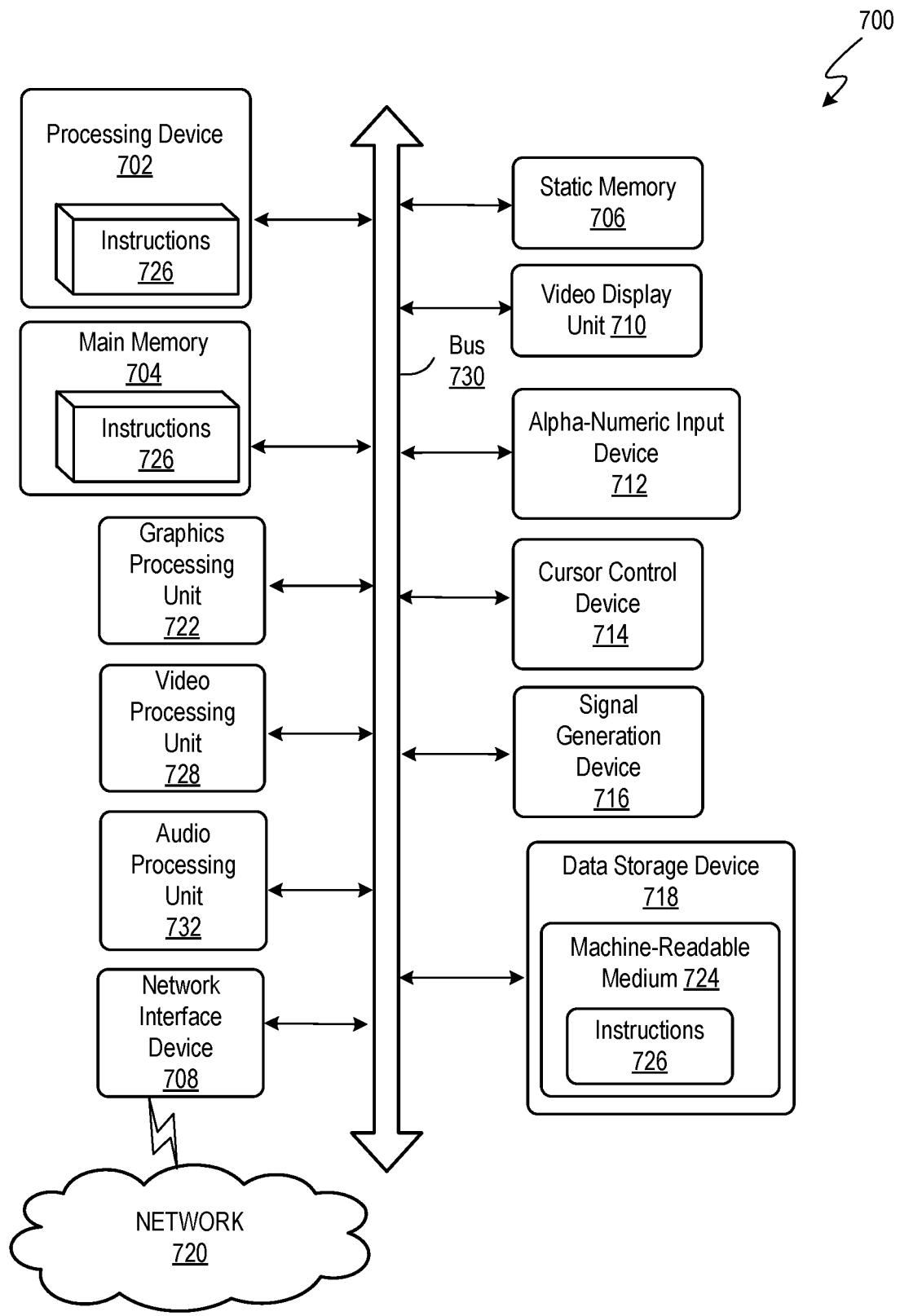
FIG. 7 illustrates an example machine of a computer system within which a set of instructions, for causing the machine to perform any one or more of the methodologies discussed herein, may be executed.

FIG. 7 illustrates an example machine of a computer system 700 within which a set of instructions, for causing the machine to perform any one or more of the methodologies discussed herein, may be executed.

In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
extracting a first set of IC design features based on each training IC design of a set of training IC designs in a first stage of an IC design flow, and
extracting a first set of IC design labels based on each training IC design of the set of training IC designs in a second stage of the IC design flow, wherein the first stage of the IC design flow occurs earlier than the second stage of the IC design flow in the IC design flow;
training, by a processor, a machine learning model based on the first set of IC design features and the first set of IC design labels; and
when a first IC design is in the first stage of the IC design flow,
extracting a second set of IC design features from the first IC design,
using the trained machine learning model to predict timing at one or more timing endpoints in the first IC design based on the second set of IC design features, and
performing an operation on the first IC design that uses the predicted timing at the one or more timing endpoints in the first IC design.

2. The method of claim 1, wherein the first stage of the IC design flow belongs to a pre-route portion of the IC design flow which ends after global routing has been completed in the IC design flow, and wherein the second stage belongs to a post-route portion of the IC design flow which begins after track assignment and detailed routing has been completed in the IC design flow.

3. The method of claim 1, wherein the first stage belongs to a pre-clock-network-synthesis portion of the IC design flow which ends after post-placement optimization has been completed in the IC design flow, and wherein the second stage belongs to a post-clock-network-synthesis portion of the IC design flow which begins after clock network synthesis has been completed in the IC design flow.

4. The method of claim 1, wherein the training the machine learning model to predict the first set of IC design labels based on the first set of IC design features using the training data comprises reducing an error term that represents an aggregate error between a predicted set of IC design labels and the first set of IC design labels.

5. The method of claim 4, wherein the reducing the error term comprises iteratively modifying parameters of the machine learning model.

6. The method of claim 1, wherein the first set of IC design features includes at least one of: a count of logic stages in a combinational logic cloud, average fanout in the combinational logic cloud, a count of inverters and buffers, a count of cells that have modification restrictions, a count of transition violations, a ratio between an aggregate net delay and an aggregate cell delay, position of cells, and size of cells.

7. The method of claim 6, wherein the first set of IC design labels includes at least one of: an arrival time at a timing endpoint, a required time at the timing endpoint, a timing slack at the timing endpoint, a slew at the timing endpoint, a noise margin at the timing endpoint, an arrival time at a terminal of a logic gate, a required time at the terminal of the logic gate, a timing slack at the terminal of the logic gate, a slew at the terminal of the logic gate, a noise margin at the terminal of the logic gate.

8. A non-transitory computer readable storage medium storing instructions, which when executed by a processor, cause the processor to:
extract a first set of IC design features from each training integrated circuit (IC) design of a set of training IC designs in a first stage of an IC design flow;
extract a first set of IC design labels from each training IC design of the set of training IC designs in a second stage of the IC design flow, wherein the second stage of the IC design flow occurs later than the first stage of the IC design flow;
train a machine learning model based on the first set of IC design features and the first set of IC design labels; and
when a first IC design is in the first stage of the IC design flow,
extract a second set of IC design features from the first IC design,
use the trained machine learning model to predict timing at one or more timing endpoints in the first IC design based on the second set of IC design features, and
perform an operation on the first IC design that uses the predicted timing at the one or more timing endpoints in the first IC design.

9. The non-transitory computer readable storage medium of claim 8, wherein the first stage of the IC design flow belongs to a pre-route portion of the IC design flow which ends after global routing has been completed in the IC design flow, and wherein the second stage belongs to a post-route portion of the IC design flow which begins after track assignment and detailed routing has been completed in the IC design flow.

10. The non-transitory computer readable storage medium of claim 8, wherein the first stage belongs to a pre-clock-network-synthesis portion of the IC design flow which ends after post-placement optimization has been completed in the IC design flow, and wherein the second stage belongs to a post-clock-network-synthesis portion of the IC design flow which begins after clock network synthesis has been completed in the IC design flow.

11. The non-transitory computer readable storage medium of claim 8, wherein the training the machine learning model to predict the first set of IC design labels based on the first set of IC design features comprises reducing an error term that represents an aggregate error between a predicted set of IC design labels and the first set of IC design labels.

12. The non-transitory computer readable storage medium of claim 11, wherein the reducing the error term comprises iteratively modifying parameters of the machine learning model.

13. The non-transitory computer readable storage medium of claim 8, wherein the first set of IC design features includes at least one of: a count of logic stages in a combinational logic cloud, average fanout in the combinational logic cloud, a count of inverters and buffers, a count of cells that have modification restrictions, a count of transition violations, a ratio between an aggregate net delay and an aggregate cell delay, position of cells, and size of cells.

14. The non-transitory computer readable storage medium of claim 13, wherein the first set of IC design labels includes at least one of: an arrival time at a timing endpoint, a required time at the timing endpoint, a timing slack at the timing endpoint, a slew at the timing endpoint, a noise margin at the timing endpoint, an arrival time at a terminal of a logic gate, a required time at the terminal of the logic gate, a timing slack at the terminal of the logic gate, a slew at the terminal of the logic gate, a noise margin at the terminal of the logic gate.

15. An apparatus, comprising:
- a memory storing instructions; and
- a processor, coupled with the memory and to execute the instructions, the instructions when executed causing the processor to:
  - collect training data for each training integrated circuit (IC) design of a set of training IC designs, wherein the collecting the training data comprises extracting a first set of IC design features from each training IC design in a first stage of an IC design flow, and extracting a first set of IC design labels from each training IC design of the set of training IC designs in a second stage of the IC design flow which occurs later than the first stage of the IC design flow;
  - use the training data to train a machine learning model; and
  - when a first IC design is in the first stage of the IC design flow,
    - extract a second set of IC design features from the first IC design,
    - use the trained machine learning model to predict timing at one or more timing endpoints in the first IC design based on the second set of IC design features, and
    - perform an operation on the first IC design that uses the predicted timing at the one or more timing endpoints in the first IC design.

16. The apparatus of claim 15, wherein the first stage of the IC design flow belongs to a pre-route portion of the IC design flow which ends after global routing has been completed in the IC design flow, and wherein the second stage belongs to a post-route portion of the IC design flow which begins after track assignment and detailed routing has been completed in the IC design flow.

17. The apparatus of claim 15, wherein the first stage belongs to a pre-clock-network-synthesis portion of the IC design flow which ends after post-placement optimization has been completed in the IC design flow, and wherein the second stage belongs to a post-clock-network-synthesis portion of the IC design flow which begins after clock network synthesis has been completed in the IC design flow.

* * * * *